(12) United States Patent
Liaw

(10) Patent No.: US 7,394,155 B2
(45) Date of Patent: Jul. 1, 2008

(54) TOP AND SIDEWALL BRIDGED INTERCONNECT STRUCTURE AND METHOD

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 250 days.

(21) Appl. No.: 10/982,455

(22) Filed: Nov. 4, 2004

(65) Prior Publication Data

US 2006/0091468 A1    May 4, 2006

(51) Int. Cl.
*H01L 23/48* (2006.01)
(52) U.S. Cl. .............. 257/758; 257/776; 257/E23.17; 257/E23.145
(58) Field of Classification Search ........... 257/776, 257/758, E23.145, E23.143, E23.17
See application file for complete search history.

(56) References Cited

U.S. PATENT DOCUMENTS

| | | | | |
|---|---|---|---|---|
| 5,536,683 A | * | 7/1996 | Lin et al. | 438/639 |
| 6,194,313 B1 | * | 2/2001 | Singh et al. | 438/675 |
| 6,329,720 B1 | * | 12/2001 | Li et al. | 257/776 |

* cited by examiner

*Primary Examiner*—Thanhha Pham
(74) *Attorney, Agent, or Firm*—Tung and Associates

(57) ABSTRACT

An interconnect structure and its method for fabrication each employ an interconnect formed over and adjacent an active region of a semiconductor substrate. A gate electrode is also formed over the active region. Spacer layers are formed adjoining the interconnect and the gate electrode. A spacer layer adjoining the interconnect is removed and a bridging silicide conductor layer is formed bridging a top surface and a sidewall surface of the interconnect with a surface of the active region.

16 Claims, 6 Drawing Sheets

TOP AND SIDEWALL BRIDGED INTERCONNECT STRUCTURE AND METHOD

BACKGROUND OF THE INVENTION

1. Field of the Invention

The invention relates generally to methods for forming interconnect structures within semiconductor products. More particularly, the invention relates to methods for forming interconnect structures with enhanced performance within semiconductor products.

2. Description of the Related Art

Semiconductor products employ devices such as resistors, transistors, diodes and capacitors that are connected and interconnected over semiconductor substrates. As semiconductor product integration levels increase, effective interconnection of devices often becomes difficult due to lithographic resolution and overlay considerations when forming patterned conductor layers.

Thus, a need exists for semiconductor device interconnect structures and methods with enhanced performance. The invention is directed towards that object.

SUMMARY OF THE INVENTION

A first object of the invention is to provide an interconnect structure for use within a semiconductor product and a method for fabricating the interconnect structure.

A second object of the invention is to provide an interconnect structure and method in accord with the first object of the invention, where the interconnect structure is fabricated with enhanced performance.

In accord with the objects of the invention, the invention provides an interconnect structure and a method for fabricating the interconnect structure.

The interconnect structure is formed of an interconnect (i.e., a patterned conductor layer) that is patterned over an active region of a semiconductor substrate. A bridging conductor layer is formed upon and contiguously interconnecting the active region, a sidewall of the interconnect and a top surface of the interconnect.

The invention provides an interconnect structure with enhanced performance, and a method for fabricating the same. The invention realizes the foregoing objects by employing a bridging conductor layer formed upon a contact region within a semiconductor substrate and bridging to a sidewall and a top surface of an interconnect patterned over the contact region of the semiconductor substrate. In particular, by bridging to the top surface of the interconnect, the bridging conductor layer provides an efficient and effective connection between the active region and the interconnect.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides an interconnect structure with enhanced performance, and a method for fabricating the same. The invention realizes the foregoing objects by employing a bridging conductor layer formed upon a contact region within a semiconductor substrate and bridging to a sidewall and a top surface of an interconnect patterned over the contact region of the semiconductor substrate. In particular, by bridging to the top surface of the interconnect, the bridging conductor layer provides an efficient and effective connection between the active region and the interconnect.

Figure 1:
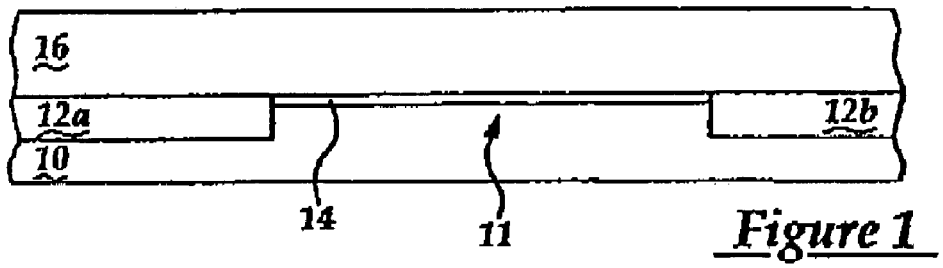
FIG. 1, FIG. 2, FIG. 3, FIG. 4, FIG. 5 and FIG. 6 show a series of schematic cross-sectional diagrams illustrating the results of progressive stages of fabricating a semiconductor product in accord with a first embodiment of the invention.

FIG. 1 to FIG. 6 show a series of schematic cross-sectional diagrams illustrating the results of progressive stages in fabricating a semiconductor product in accord with a first preferred embodiment of the invention. FIG. 1 shows a schematic cross-sectional diagram illustrating an early stage in fabricating the semiconductor product.

FIG. 1 shows a semiconductor substrate 10. A pair of isolation regions 12a and 12b is formed within the semiconductor substrate 10 to define an active region 11 thereof. A blanket gate dielectric layer 14 is formed upon the active region 11. A blanket interconnect and gate electrode material layer 16 is formed upon the pair of isolation regions 12a and 12b, and the blanket gate dielectric layer 14.

The semiconductor substrate 10 may be formed from any of several semiconductor materials and constructions, including but not limited to bulk silicon, non-bulk silicon, silicon-germanium alloy and silicon-on-insulator (SOI) semiconductor materials and constructions. Preferably, the semiconductor substrate 10 is a silicon semiconductor substrate. It may have either dopant polarity and any of several dopant concentrations and crystallographic orientations.

The pair of isolation regions 12a and 12b is typically formed as a pair of shallow trench isolation (STI) regions, although the invention is not so limited. Typically, the pair of isolation regions 12a and 12b is formed of a silicon oxide material, although other dielectric materials may also be employed. Typically, the pair of isolation regions 12a and 12b is formed to a thickness of greater than about 2500 angstroms.

The blanket gate dielectric layer 14 is typically formed of a silicon oxide material formed by thermal oxidation of the semiconductor substrate 10. The gate dielectric layer may alternatively be formed of comparatively higher dielectric constant dielectric materials (i.e., dielectric constant greater than about 5) such as silicon nitride dielectric materials and hafnium, tantalum and aluminum oxide containing dielectric materials. Typically the blanket gate dielectric layer 14 is formed to a thickness of from about 10 to about 100 angstroms, but typically less than about 20 angstroms.

The blanket interconnect and gate electrode material layer 16 may be formed from any of several conductor materials. The conductor materials may include, but are not limited to doped polysilicon (i.e., having a dopant concentration greater than about 1E18 dopant atoms per cubic centimeter) materials, polycide (i.e., doped polysilicon/metal silicide stack) materials, refractory metal materials, alloys thereof and nitrides thereof. Typically, the blanket interconnect and gate electrode material layer 16 is formed of a doped polysilicon material typically formed to a thickness of from about 1500 to about 2500 angstroms. Thicknesses less than about 1500 angstroms are also acceptable.

Figure 2:
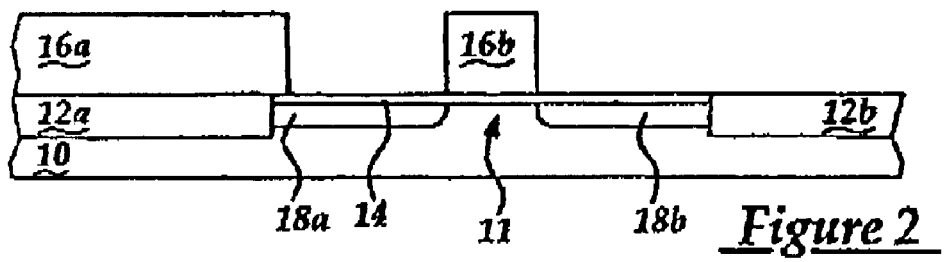

FIG. 2 shows the results of patterning the blanket interconnect and gate electrode material layer 16 to form an interconnect 16a and a gate electrode 16b. The interconnect 16a is patterned such as to terminate over the active region 11 while primarily covering the isolation region 12a. The gate electrode 16b is nominally centered over the active region 11 of the semiconductor substrate 10. The blanket interconnect and gate electrode material layer 16 may be patterned to form the interconnect 16a and the gate electrode 16b while employing etch methods as are conventional in the semiconductor product fabrication art. The etch methods will typically be anisotropic plasma etch methods.

FIG. 2 also shows a pair of lightly doped extension regions 18a and 18b formed into the active region 11 of the semiconductor substrate 10. They are typically formed employing ion implant methods as are conventional in the semiconductor product fabrication art, while also employing the gate electrode 16b as a mask.

Figure 3:
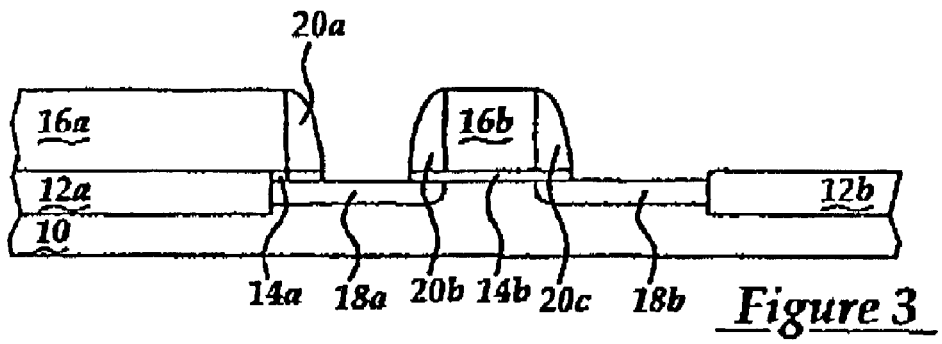

FIG. 3 shows the results of forming a series of spacer layers 20a, 20b and 20c upon the semiconductor product of FIG. 2. Spacer layer 20a adjoins a sidewall of the interconnect 16a. Spacer layers 20b and 20c adjoin a pair of sidewalls of the gate electrode 16b. The series of spacer layers 20a, 20b and 20c is formed employing a blanket layer deposition and anisotropic etchback method as is otherwise generally conventional in the semiconductor product fabrication art. The series of spacer layers 20a, 20b and 20c may be formed of single layer or separate laminated material layers. They are generally formed of dielectric materials, including but not limited to silicon oxides, silicon nitrides, lower dielectric constant dielectric materials (i.e., dielectric constant less than 3 such as spin-on dielectric materials) and higher dielectric constant dielectric materials (i.e., dielectric constant greater than about 5, such as hafnium, tantalum or aluminum oxides).

FIG. 3 also shows the results of patterning the blanket gate dielectric layer 14 to form a pair of patterned gate dielectric layers 14a and 14b. The patterning will generally occur when forming the series of spacer layers 20a, 20b and 20c.

Figure 4:
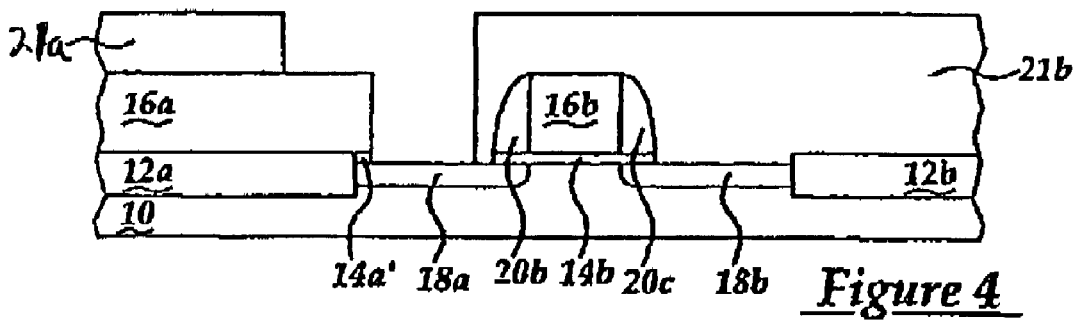

FIG. 4 first shows a pair of patterned photoresist layers 21a and 21b that mask most of the features of the semiconductor product of FIG. 3. However, they leave exposed a portion of the interconnect 16a, the spacer layer 20a and the lightly doped extension region 18a. FIG. 4 also shows the results of stripping the spacer layer 20a from the sidewall of the interconnect 16a. The spacer layer 20a may be stripped employing an appropriate etchant. In addition, the etchant may also further etch the patterned gate dielectric layer 14a to form a twice patterned gate dielectric layer 14a0. The pair of patterned photoresist layers 21a and 21b is typically formed to a thickness of from about 0.05 to about 1 micron while employing a photoexposure wavelength of less than 400 nanometers. The pair of patterned photoresist layers 21a and 21b may be formed employing photoresist methods that also include hard mask layers and antireflective coating layers.

Figure 5:
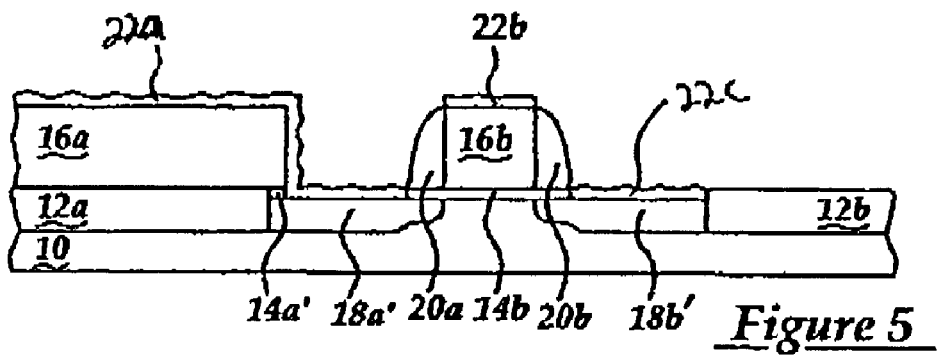

FIG. 5 first shows the results of stripping the pair of patterned photoresist layers 21a and 21b from the semiconductor product of FIG. 4. The pair of patterned photoresist layers 21a and 21b may be stripped employing stripping methods and materials as are conventional in the semiconductor product fabrication art.

FIG. 4 first shows a pair of patterned photoresist layers 21a and 21b that mask most of the features of the semiconductor product of FIG. 3. However, they leave exposed a portion of the interconnect 16a, the spacer layer 20a and the lightly doped extension region 18a. FIG. 4 also shows the results of stripping the spacer layer 20a from the sidewall of the interconnect 16a. The spacer layer 20a may be stripped employing an appropriate etchant. In addition, the etchant may also further etch the patterned gate dielectric layer 14a to form a twice patterned gate dielectric layer 14a'. The pair of patterned photoresist layers 21a and 21b is typically formed to a thickness of from about 0.05 to about 1 micron while employing a photoexposure wavelength of less than 400 nanometers. The pair of patterned photoresist layers 21a and 21b may be formed employing photoresist methods that also include hard mask layers and antireflective coating layers.

FIG. 5 also shows the results of forming a series of silicide layers 22a, 22b and 22c. The silicide layer 22a serves as a bridging conductor layer and ohmic contact layer formed upon a top surface and sidewall surface of the interconnect 16a, and bridging to the source/drain region 18a'. Silicide layer 22b is formed upon the gate electrode 16b. Silicide layer 22c is formed upon the source/drain region 18b'. The series of silicide layers 22a, 22b and 22c is formed employing a thermal annealing method that employs a blanket metal silicide forming metal layer. Typically a metal silicide forming metal is formed to a thickness of less than about 200 angstroms and thermally annealed to provide silicide of thickness less than about 350 angstroms when thermally annealed in contact with a silicon material. The silicon material is generally either polysilicon or monocrystalline silicon. The silicide layers 22a, 22b and 22c may be formed employing a refractory metal, titanium, cobalt, nickel, or tungsten silicide, along with a titanium nitride, tungsten nitride, tantalum nitride or composite layer thereof. The silicide layer 22a provides a contact resistance of less than 100 ohms per square between the interconnect 16a and the source/drain region 18a'. In the alternative of the silicide layer 22a, formed employing the foregoing thermal annealing salicide method, a corresponding bridging conductor layer may be formed employing a deposition and patterning method. Such a bridging conductor layer may be formed of a conductor material selected from the group consisting of silicide, metals (including refractory metals) and nitrides thereof.

FIG. 5 next shows the results of forming a pair of source/drain regions 18a' and 18b' that incorporate the pair of lightly doped extension regions 18a and 18b. The pair of source/drain regions 18a' and 18b' is formed while employing the gate electrode 16b and the pair of spacer layers 20b and 20c as a mask, in conjunction with an otherwise conventional ion implant method.

Figure 6:
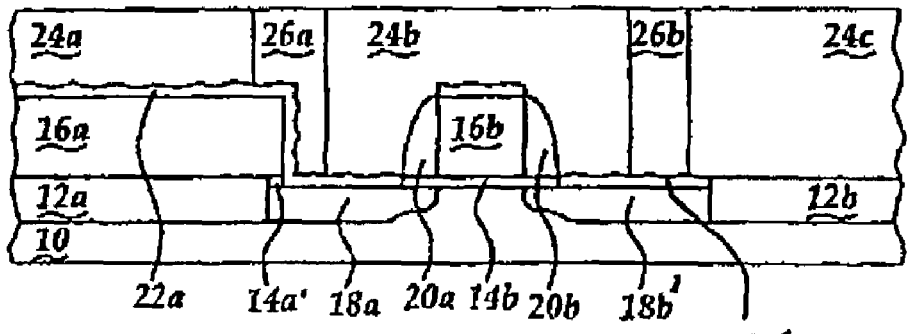

FIG. 6 shows a schematic cross-sectional diagram of a semiconductor product in accord with a first preferred embodiment of the invention. The semiconductor product provides a field effect transistor device fabricated within an active region of a semiconductor substrate. An interconnect is patterned to extend over a source/drain region within the field effect transistor device. A bridging conductor layer (in the form of a silicide layer) is formed bridging a top and sidewall surface of the interconnect with a surface of the source/drain region. Such an interconnect structure is effectively and efficiently fabricated while employing a thermal annealing method. It also provide an efficient and effective electrical contact since the bridging conductor layer is formed upon both a top and sidewall surface of the interconnect rather than only a sidewall surface of the interconnect.

FIG. 7 to FIG. 12 show a series of schematic cross-sectional diagrams illustrating the results of progressive stages in fabricating a semiconductor product in accord with a second preferred embodiment of the invention.

Figure 7:
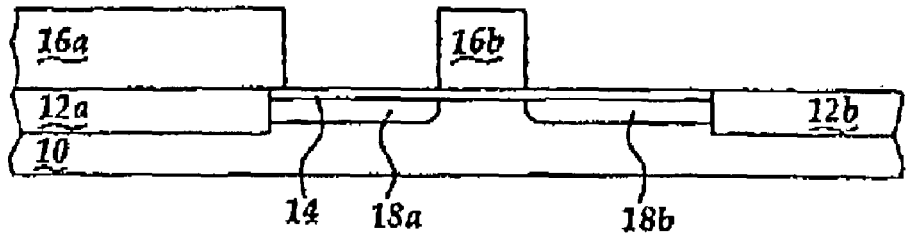
FIG. 7, FIG. 8, FIG. 9, FIG. 10.

FIG. 7 shows a semiconductor product identical with the semiconductor product of FIG. 2. Like structures are identified with identical reference numerals.

Figure 8:
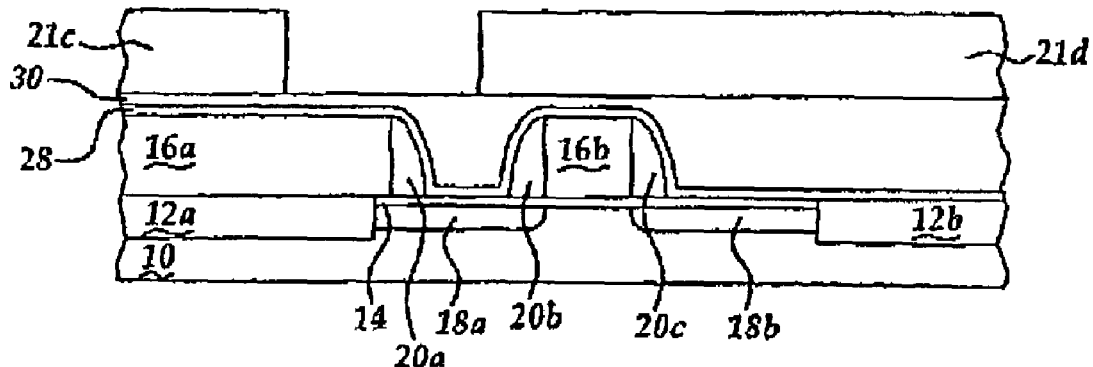

FIG. 8 first shows spacer layers 20a, 20b and 20c as are otherwise identical to the spacer layers 20a, 20b and 20c as illustrated in FIG. 3.

FIG. 8 next shows a blanket conformal liner layer 28 formed upon the resulting semiconductor product that corresponds with FIG. 3. A blanket planarizing layer 30 is formed upon the blanket conformal liner layer 28. A pair of patterned photoresist layers 21*c* and 21*d* is formed upon the blanket planarizing layer 30. The pair of patterned photoresist layers 21*c* and 21*d* leaves exposed a portion of the blanket planarizing layer 30 over the interconnect 16*a*, the spacer layer 20*a* and the lightly doped extension region 18*a*.

The blanket conformal liner layer 28 is formed to a thickness of from about 50 to about 500 angstroms. Generally, the blanket conformal liner layer is formed of a silicon oxide or silicon nitride material. Other materials may also be employed. The blanket planarizing layer 28 may be formed of a spin-on-polymer (SOP) material, a spin-on-glass (SOG) material or other planarizing material. The blanket planarizing layer 30 is formed to a thickness of from about 800 to about 4000 angstroms. The pair of patterned photoresist layers 21*c* and 21*d* is otherwise generally analogous to the pair of patterned photoresist layers 21*a* and 21*b* as illustrated in FIG. 4, but formed upon a planarized surface rather than a topographic surface.

Figure 9:
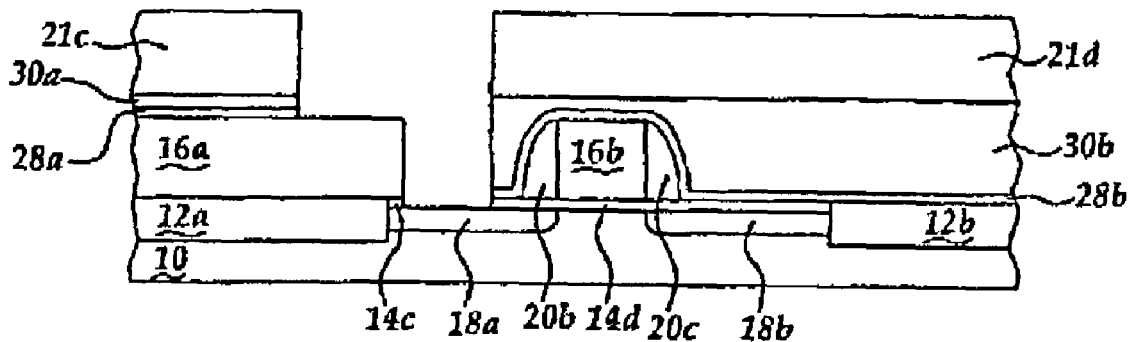

FIG. 9 shows the results of: (1) patterning the blanket planarizing layer 30 to form a pair of patterned planarizing layers 30*a* and 30*b*; (2) patterning the blanket conformal liner layer 28 to form a pair of patterned conformal liner layers 28*a* and 28*b*; (3) patterning the blanket gate dielectric layer 14 to form a pair of patterned gate dielectric layers 14*c* and 14*d*; and (4) stripping the spacer layer 20*a* from adjoining the sidewall of the interconnect 16*a*. The foregoing pattering and stripping may be effected employing either or both of wet chemical and dry plasma etching methods. The etching leaves exposed a top and a sidewall portion of the interconnect 16*a*, as well as a surface of the lightly doped extension region 18*a*.

Figure 10:
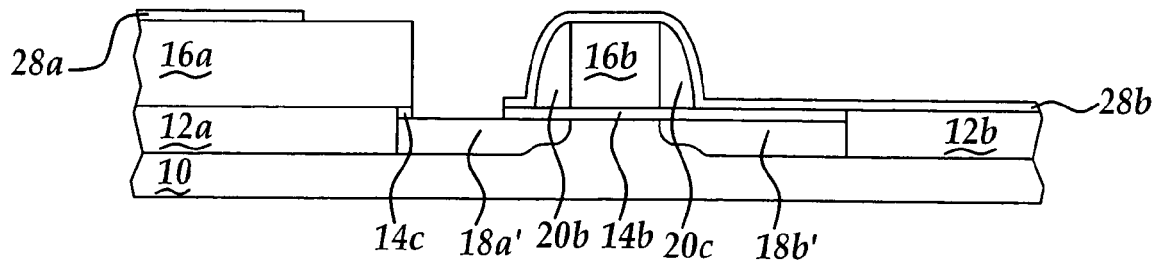

FIG. 10 first shows the results of stripping the pair of patterned photoresist layers 21*c* and 21*d* and the pair of patterned planarizing layers 30*a* and 30*b* from the semiconductor product of FIG. 9. The foregoing patterned layers may be stripped employing methods and materials as are otherwise conventional in the semiconductor product fabrication art.

FIG. 10 next shows the results of forming the pair of source/drain regions 18*a*' and 18*b*' into the active region of the semiconductor substrate. The pair of source/drain regions 18*a*' and 18*b*' is formed analogously with the first preferred embodiment of the invention as illustrated in FIG. 5.

Figure 11:
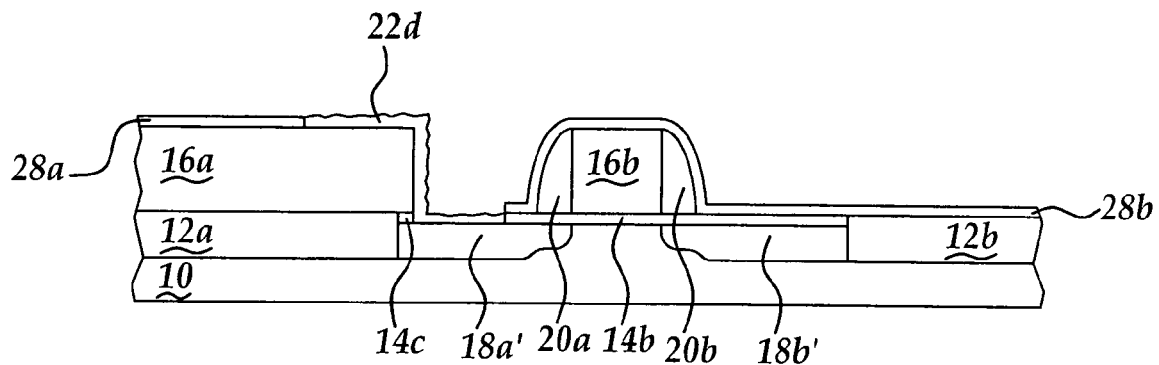
FIG. 11 and FIG. 12 show a series of schematic cross-sectional diagrams illustrating the results of progressive stages of fabricating a semiconductor product in accord with a second embodiment of the invention.

FIG. 11 shows the results of forming a silicide layer 22*d* upon the exposed portions of the top surface and sidewall surface of the interconnect 16*a*, and the surface of the source/drain region 18*a*0. The silicide layer 22*d* is formed analogously with the silicide layers 22*a*, 22*b* and 22*c* as illustrated in FIG. 6, but due to the presence of the patterned conformal liner layer 28*b* silicide layers are not formed upon the gate electrode 16*b* or the source/drain region 18*b*'.

Figure 12:
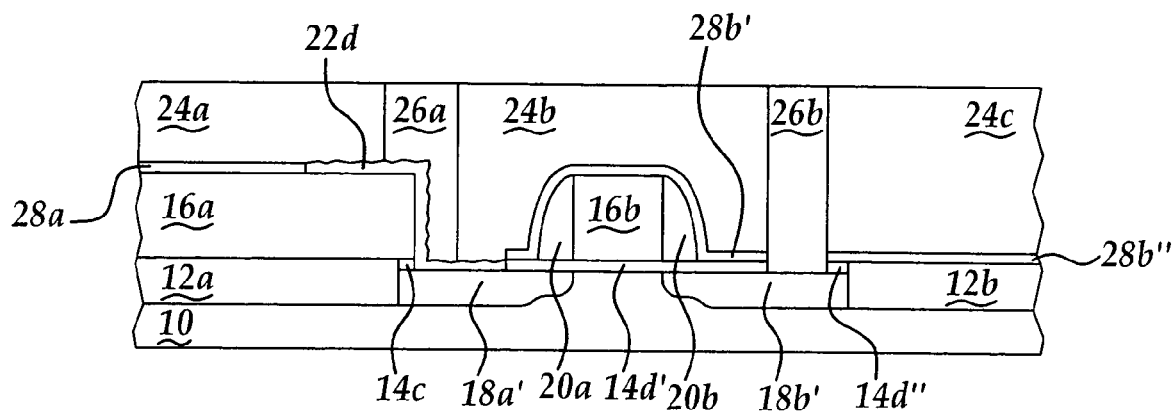

FIG. 12 shows the results of forming the series of patterned interlevel dielectric layers 24*a*, 24*b* and 24*c* and the pair of conductor stud layers 26*a* and 26*b* upon the semiconductor product of FIG. 11. The series of patterned interlevel dielectric layers 24*a*, 24*b* and 24*c* and the pair of conductor stud layers 26*a* and 26*b* are otherwise identical to those employed within the first embodiment of the invention as illustrated in FIG. 6. The patterned conformal liner layer 28*b* and the patterned gate electrode layer 14*d* are further patterned to form a pair of twice patterned conformal liner layers 28*b*' and 28*b*" and a pair of twice patterned gate dielectric layers 14*d*' and 14*d*", such that the conductor stud layer 26*b* may reach the source/drain region 18*b*'.

FIG. 11 shows the results of forming a silicide layer 22*d* upon the exposed portions of the top surface and sidewall surface of the interconnect 16*a*, and the surface of the source/drain region 18*a*'. The silicide layer 22*d* is formed analogously with the silicide layers 22*a*, 22*b* and 22*c* as illustrated in FIG. 6, but due to the presence of the patterned conformal liner layer 28*b* silicide layers are not formed upon the gate electrode 16*b* or the source/drain region 18*b*'.

Figure 13:
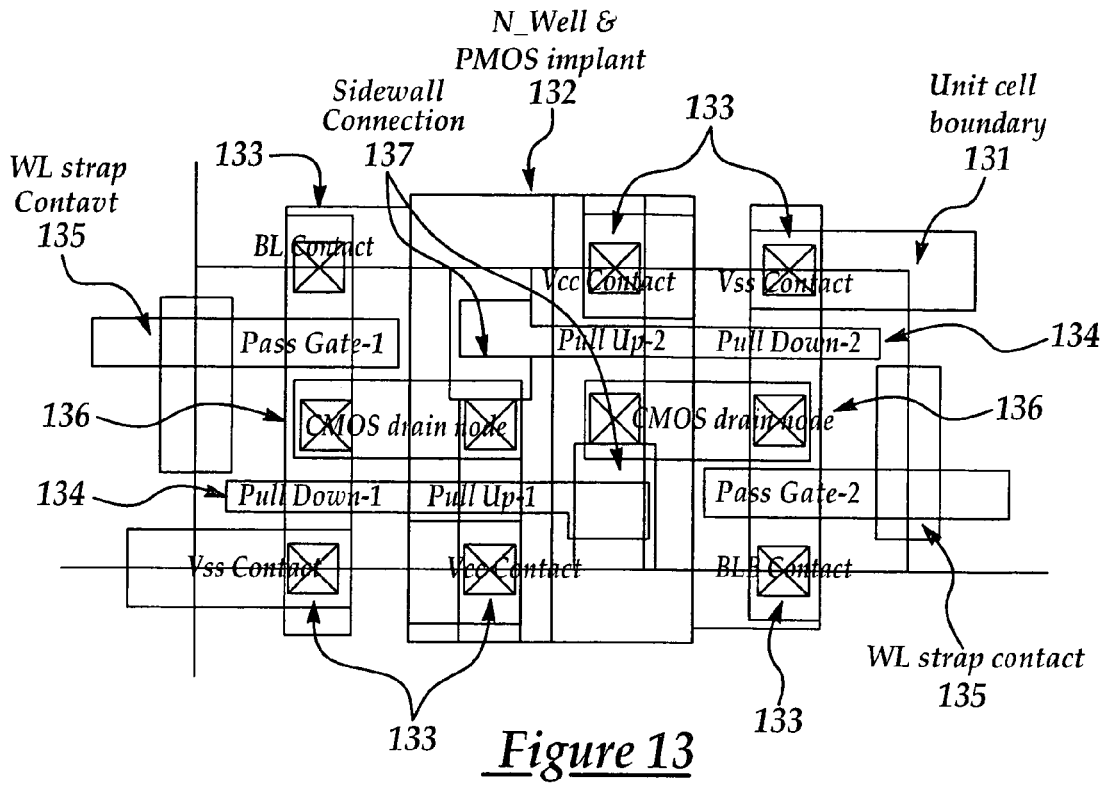
FIG. 13, FIG. 14, FIG. 15, FIG. 16 and FIG. 17 show a series of schematic plan view diagrams illustrating a series of semiconductor product layouts that may incorporate an interconnect structure in accord with the invention.

FIG. 13 shows a schematic plan view diagram of a static random access memory (SRAM) cell substrate level layout that employs an interconnect structure in accord with the invention. FIG. 13 first shows a unit cell boundary 131 for the SRAM cell. An N-well and PMOS region 132 is contained mostly within the unit cell boundary 131. The unit cell includes six transistors. Four are defined by two pair of pull-up and pull-down gates 134. The remaining two are pass transistors that include the pass gates that are accessed through the wordline (WL) strap contacts 135. The unit cell also includes multiple contacts 133 including Vss, Vcc, bitline (BL) and bitline bar (BLB) contacts. Finally, the unit cell includes a pair of CMOS drain nodes 136.

A pair of sidewall connections 137 in accord with the invention is formed upon each of the pair of CMOS drain nodes 136 and bridging to a pair of interconnects that eventually connect to each of the pair of pull-up and pull-down gates 134. The CMOS drain nodes 136 are connected to source nodes of the pass transistors. The drain nodes of the pass transistors are connected to bitline or bitline bar contacts.

Figure 14:
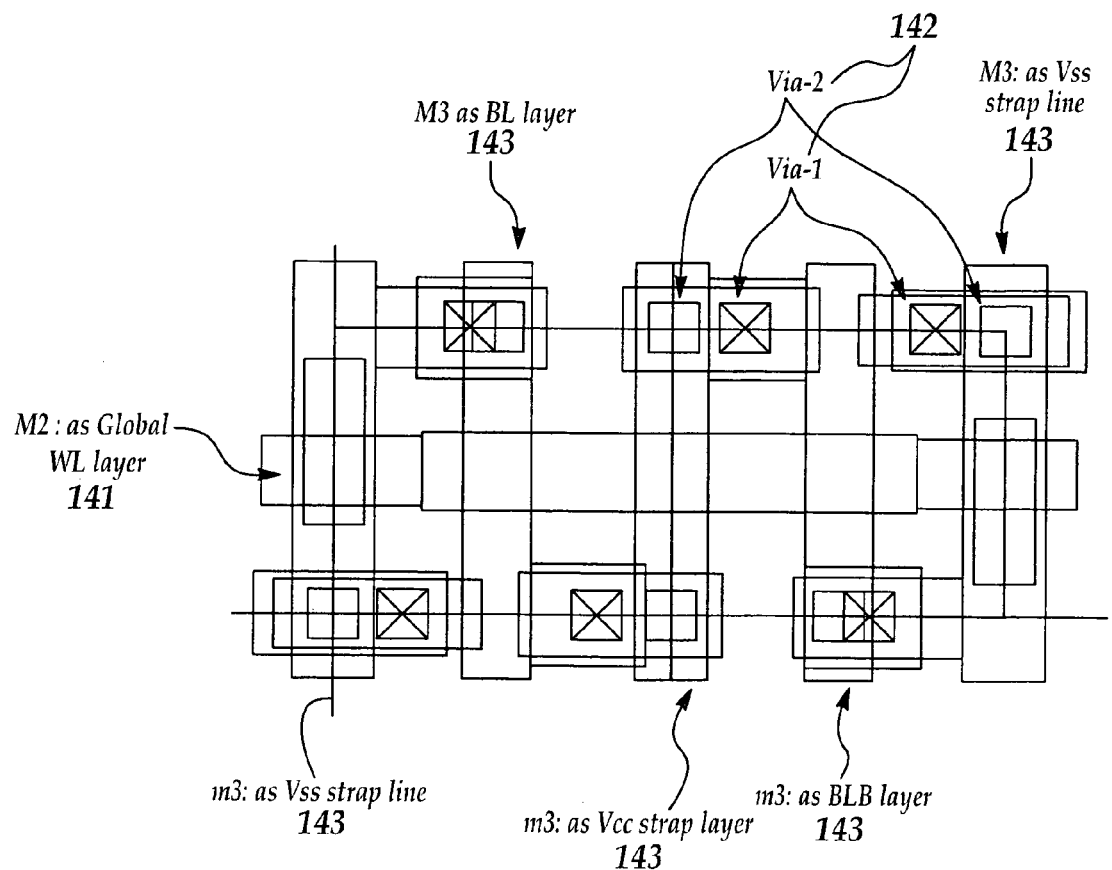

FIG. 14 shows a schematic plan view diagram of upper level metal layers that is intended to overlay with the schematic plan view diagram of FIG. 13.

FIG. 14 shows metal layer M2 141 in the position of a wordline layer. FIG. 14 also shows the locations of vias 142, including first vias and second vias. FIG. 14 finally shows the various locations and functions of metal layer M3 143. The functions include metal layer M3 as bitline (BL), bitline bar (BLB), Vss strap and Vcc strap. Bitline and bitline bar layers are separated by Vss or Vcc layers for shielding.

Figure 15:
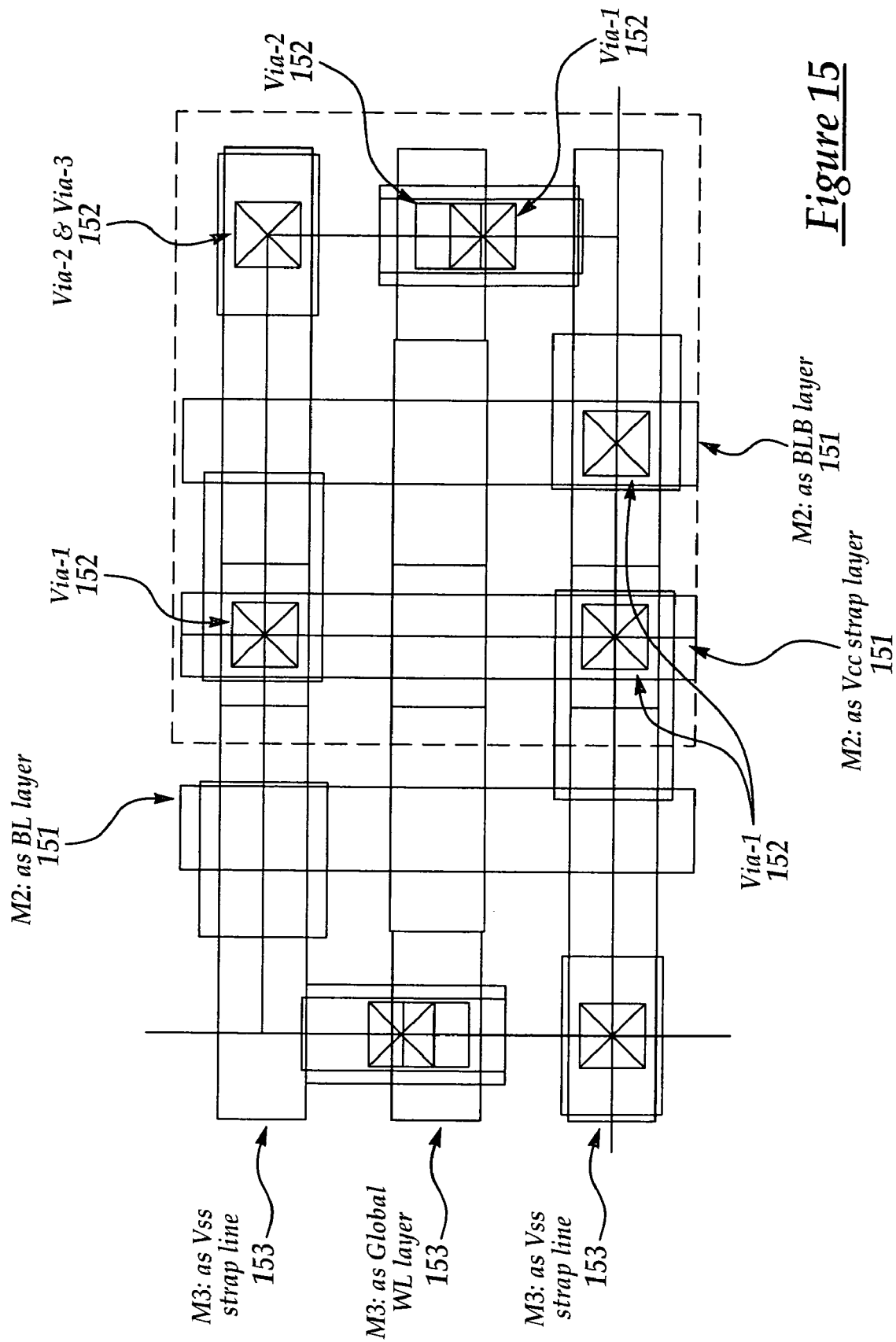

FIG. 15 shows a schematic plan view diagram of an alternate upper level wiring diagram that is intended to overlay with the schematic plan view diagram of FIG. 13.

FIG. 15 shows the locations of vias 152 including first vias, second vias and third vias. FIG. 15 also shows the locations and functions of metal layer M2 151. The functions include bitline (BL) bitline bar (BLB) and Vcc strap. Again, Vcc strap serves shielding purposes. Finally, FIG. 15 shows the locations and functions of metal layer M3 153. Metal layer M3 153 serves as a wordline (WL) layer, as well as a Vss strap layer.

Figure 16:
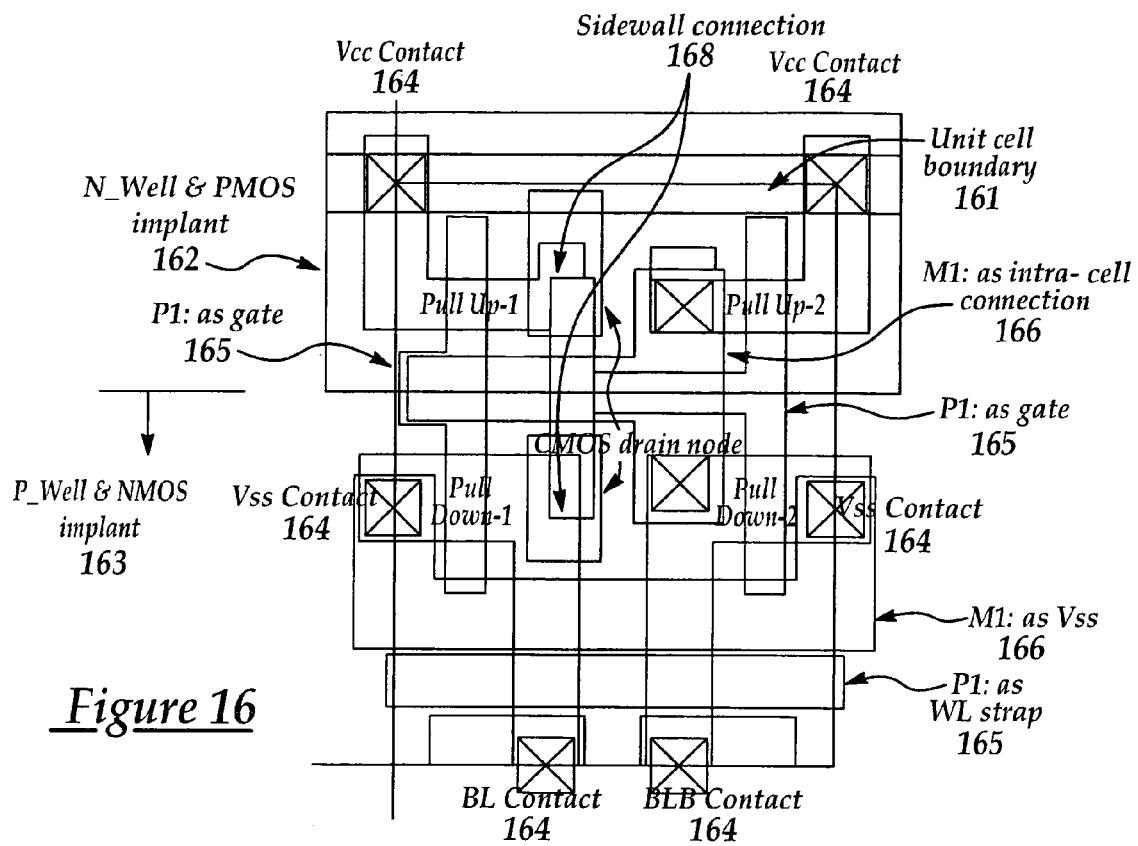

FIG. 16 shows a schematic plan view diagram of an alternative substrate level layout of a static random access memory (SRAM) cell. This alternative SRAM cell also incorporates an interconnect structure in accord with the invention.

The SRAM cell has a unit cell boundary 161. N-well/PMOS implant region 162 and P-well/NMOS implant region 163 are contained in part within the unit cell boundary 161. Various contacts 164, including bitline (BL), bitline bar (BLB), Vcc and Vss contacts are also contained at least in part within the unit cell boundary 161. Polysilicon P1 165 is shown in locations of: (1) wordline (WL) strap as pass gates 1/2; and (2) pull-up/pull-down gates 1/2. Metal 1 166 is shown as Vss contact metal and intra-cell connection metal. CMOS drain nodes 167 are also shown. Finally, sidewall connections 168 are shown in accord with the invention. The sidewall connections 168 connect a drain region of a pull-up 1 or pull-down 1 transistor to an interconnect that eventually serves as a gate electrode within a pull-up 2 or pull-down 2 transistor 165.

Figure 17:
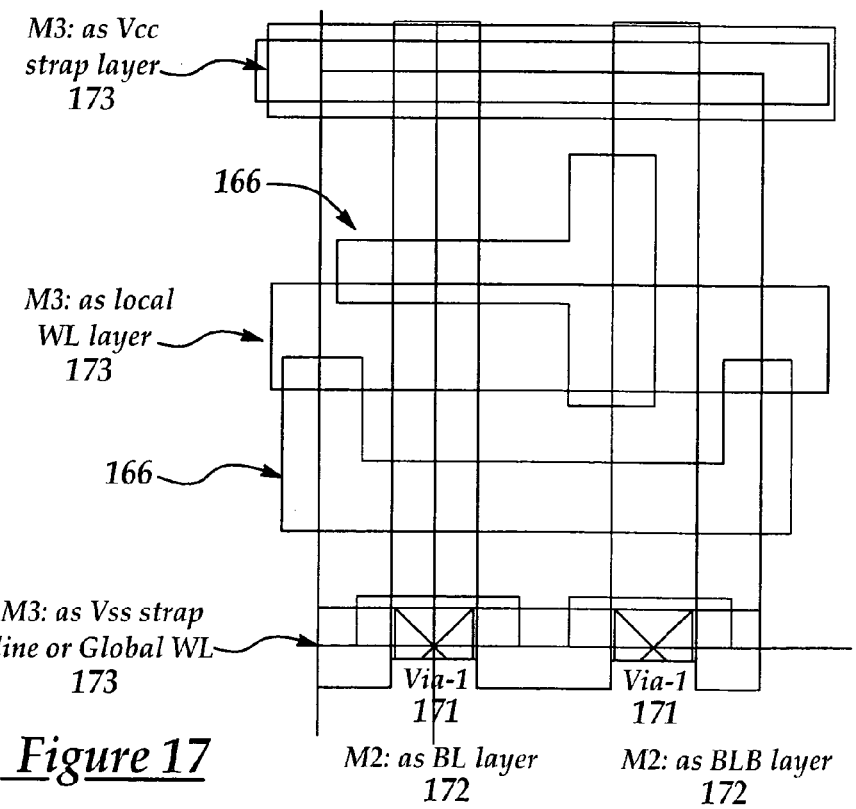

FIG. 17 shows an upper level metal layout diagram intended to overlay with the substrate level diagram of FIG. 16. The positions of vias 171 is shown. In addition, the positions of metal layer M2 172 is shown as bitline (BL) and bitline bar (BLB). Finally, the locations of metal layer M3 173 is shown as Vcc, Vss, local wordline (WL) and global wordline (WL). The second level metal layer M2 172 provides a Vss vertical conductor and optionally also a Vcc vertical conductor. The Vss conductor provides a shielding function.

The schematic plan view diagrams of FIGS. 13 to 17 show a series of layouts for SRAM cells. The SRAM cells include butted sidewall connections in accord with the invention. The butted sidewall connections provide for more efficient and effective fabrication of the SRAM cells. Although not specifically illustrated in FIGS. 13-17, additional components are also included within the SRAM cells. The additional components include: (1) implant regions for device tuning); (2) first level contacts from source/drain regions and gates to M1 metal layers; (3) metal 1 interconnections for wordlines, Vcc, Vss, bitlines and bitlines bar; and (4) related second level contacts. The foregoing layouts may also have additional metal layers beyond an M3 layer. Up to about 100 metal layers may be accommodated. In general, in the foregoing layouts wordlines will strap cells in grouped series of eight.

The preferred embodiments of the invention are illustrative of the invention rather than limiting of the invention. Revisions and modifications may be made to methods, materials, structures and dimensions of a butted sidewall and top surface connection in accord with the preferred embodiments of the invention. Such revisions and modifications still provide a semiconductor product in accord with the invention, further in accord with the accompanying claims.

What is claimed is:

1. An interconnect structure comprising:
    a substrate having an active region, said active region comprising a gate structure having a gate electrode over a gate dielectric layer in said active region and first and second source/drain regions adjacent each side of said gate structure wherein said first source/drain region located between said gate structure and said shallow trench isolation region;
    a patterned conductor layer over a shallow trench isolation region adjacent the active region;
    a bridging conductor layer formed upon a top surface and and directly contact a top surface of said patterned conductor layer, an entire sidewall surface of said patterned conductor layer, layer, and a surface of the active region, said bridging conductor layer forming an electrical connection between said patterned conductor layer and said surface of said active region; and,
    an interlevel dielectric layer over said bridging conductor layer, said gate electrode, and said second source/drain region;
    a first conductor filled via extending through said interlevel dielectric layer to said bridging conductor layer, said first conductor filled via over a portion of said patterned conductor layer and a portion of said first source/drain region, said first conductor filled via extending to said bridging conductor layer including to said bridging conductor layer upon and directly contact said top surface and said entire sidewall surface of the patterned conductor layer.

2. The interconnect structure of claim 1 wherein the patterned conductor layer comprises a material selected from the group consisting of doped polysilicon, metals, refractory metals, metal silicides, metal nitrides and composites thereof.

3. The interconnect structure of claim 1 wherein the patterned conductor layer has a thickness of less than 1500 angstroms.

4. The interconnect structure of claim 1 wherein the bridging conductor layer has a thickness of less than 350 angstroms.

5. The interconnect structure of claim 1 wherein the shallow trench isolation region has a thickness greater than 2500 angstroms.

6. The interconnect structure of claim 1 wherein the substrate is selected from the group consisting of bulk silicon, non-bulk silicon, silicon-germanium alloy, silicon on insulator or composites thereof.

7. The interconnect structure of claim 1, wherein said bridging conductor layer on said surface of the active region comprises said bridging conductor layer on said first source/drain region.

8. The interconnect structure of claim 1, wherein said bridging conductor layer comprises a material selected from the group consisting of refractory metals, titanium, cobalt, nickel, platinum, metal silicides, and composites comprising nitrides and alloys thereof.

9. The interconnect structure of claim 1, wherein said bridging conductor layer comprises a metal silicide.

10. An interconnect structure comprising:
    a substrate having an active region, said active region comprising a gate structure having a gate electrode over a gate dielectric layer in said active region and first and second source/drain regions adjacent either side of said gate structure;
    a patterned conductor layer adjacent the active region, said patterned conductor layer over a shallow trench isolation region and partially overlying said active region;
    a bridging conductor layer formed upon a top surface and and directly contact a top surface of said patterned conductor layer, an entire sidewall surface of said patterned conductor layer, layer, and a surface of the first source/drain region, said bridging conductor layer forming an electrical connection between said patterned conductor layer and said first source/drain region;
    an interlevel dielectric layer over said bridging conductor layer, said gate electrode, and said second source/drain region; and,
    a first conductor filled via extending through said interlevel dielectric layer to said bridging conductor layer, said first conductor filled via over a portion of said patterned conductor layer and a portion of said first source/drain region, said first conductor filled via extending to said bridging conductor layer including to said bridging conductor layer upon and directly contact said top surface and said entire sidewall surface of said patterned conductor layer.

11. The interconnect structure of claim 10, wherein said first conductor filled via forms a butted sidewall connection to said bridging conductor layer over a top and sidewall portion of said patterned conductor layer and to said bridging conductor layer over said first source/drain region.

12. The interconnect structure of claim 10, further comprising a second conductor filled via extending through said interlevel dielectric layer to said second source/drain region.

13. The interconnect structure of claim 10, wherein a top portion of said second source/drain region comprises a conductor.

14. The interconnect structure of claim 10, further comprising a liner layer on said bridging conductor layer, said gate electrode, and said second source/drain region, said liner layer underlying said interlevel dielectric layer, said liner layer absent over said first source/drain region.

15. The interconnect structure of claim 10, wherein said bridging conductor layer comprises a material selected from the group consisting of refractory metals, titanium, cobalt, nickel, platinum, metal silicides, and composites comprising nitrides and alloys thereof.

16. The interconnect structure of claim 10, wherein said bridging conductor layer comprises a metal silicide.

* * * * *